United States Patent
Brody et al.

(10) Patent No.: US 7,132,016 B2
(45) Date of Patent: Nov. 7, 2006

(54) SYSTEM FOR AND METHOD OF MANUFACTURING A LARGE-AREA BACKPLANE BY USE OF A SMALL-AREA SHADOW MASK

(75) Inventors: Thomas Peter Brody, Pittsburgh, PA (US); Paul R. Malmberg, Pittsburgh, PA (US)

(73) Assignee: Advantech Global, Ltd, Tortola (VG)

( * ) Notice: Subject to any disclaimer, the term of this patent is extended or adjusted under 35 U.S.C. 154(b) by 47 days.

(21) Appl. No.: 10/925,726

(22) Filed: Aug. 25, 2004

(65) Prior Publication Data

US 2005/0031783 A1    Feb. 10, 2005

Related U.S. Application Data

(63) Continuation-in-part of application No. 10/255,972, filed on Sep. 26, 2002, now Pat. No. 6,943,066.

(51) Int. Cl.
*C23C 16/00* (2006.01)
*B05D 5/06* (2006.01)
*B05D 5/12* (2006.01)

(52) U.S. Cl. .......... 118/720; 118/719; 118/729; 427/69; 438/907; 438/908

(58) Field of Classification Search .......... 118/715, 118/719, 720, 729; 427/68, 69; 438/761, 438/674, 907, 908
See application file for complete search history.

(56) References Cited

U.S. PATENT DOCUMENTS

| | | | |
|---|---|---|---|
| 3,657,613 A * | 4/1972 | Brody et al. .......... 257/66 |
| 4,814,056 A * | 3/1989 | Welty .......... 204/298.11 |
| 4,919,749 A | 4/1990 | Mauger et al. |
| 5,742,129 A * | 4/1998 | Nagayama et al. .......... 315/167 |
| 6,384,529 B1 | 5/2002 | Tang et al. |
| 6,403,392 B1 * | 6/2002 | Burrows et al. .......... 438/22 |
| 6,592,933 B1 | 7/2003 | Himeshima et al. |
| 6,821,348 B1 * | 11/2004 | Baude et al. .......... 118/720 |
| 2002/0011785 A1 | 1/2002 | Tang et al. |
| 2002/0139303 A1 * | 10/2002 | Yamazaki et al. .......... 118/719 |
| 2002/0179013 A1 * | 12/2002 | Kido et al. .......... 118/718 |
| 2003/0193285 A1 | 10/2003 | Kim |
| 2004/0043602 A1 * | 3/2004 | Wada et al. .......... 438/631 |

OTHER PUBLICATIONS

U.S. Appl. No. 60/386,525 (Brody et al.), filed Jun. 5, 2002.*

* cited by examiner

*Primary Examiner*—Carl Whitehead, Jr.
*Assistant Examiner*—Heather A. Doty
(74) *Attorney, Agent, or Firm*—The Webb Law Firm

(57) ABSTRACT

A vapor deposition shadow mask system includes a number of series connected vacuum vessels each having a material deposition source and shadow mask positioned therein. A substrate is translated along a path that has a longitudinal axis that extends through the vacuum vessels. Centers of shadow masks in first and second vacuum vessels are offset laterally on opposite sides of the longitudinal axis. The system is operative for depositing material on a second area of the substrate via the material deposition source and shadow mask in the second vacuum vessel in a manner that overlaps a portion of the material deposited on a first, adjacent area of the substrate via the material deposition source and shadow mask in the first vacuum vessel.

25 Claims, 6 Drawing Sheets

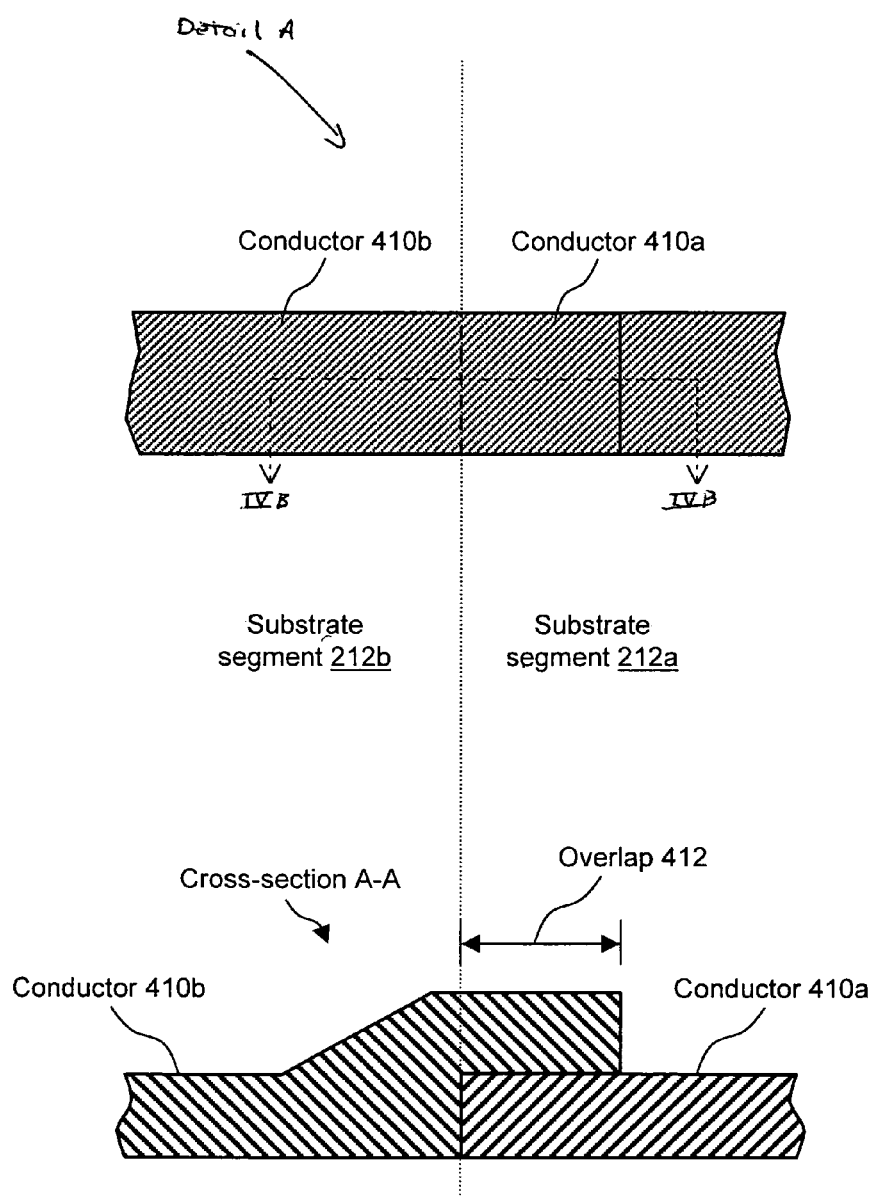

SYSTEM FOR AND METHOD OF MANUFACTURING A LARGE-AREA BACKPLANE BY USE OF A SMALL-AREA SHADOW MASK

CROSS-REFERENCE TO RELATED APPLICATION

This application is a continuation-in-part of U.S. patent application Ser. No. 10/255,972, filed Sep. 26, 2002, now U.S. Pat. No. 6,943,066 entitled "Active Matrix Backplane For Controlling Controlled Elements And Method Of Manufacture Thereof", which is incorporated herein by reference.

BACKGROUND OF THE INVENTION

1. Field of the Invention

The present invention relates to manufacturing backplanes for large-scale flat panel displays and, more particularly, to a system and method of forming a large-area backplane by use of one or more small-area shadow masks.

2. Description of Related Art

Active matrix backplanes are widely used in flat panel displays for routing signals to pixels of the display in order to produce viewable pictures. Presently, such active matrix backplanes are formed via a photolithographic manufacturing process, which has been driven in the market by the demand for higher and higher resolution displays which are not otherwise possible with other manufacturing processes. Photolithography is a pattern definition technique which uses radiation, such as ultraviolet (UV) radiation, to expose a layer of resist that is deposited on the surface of a substrate. Exemplary photolithography processing steps to produce an active matrix backplane include coat photoresist, pre-bake, soak, bake, align/expose, develop, rinse, bake, deposit layer, lift off photoresist, scrub/rinse and dry. As can be seen, the photolithographic manufacturing process for producing an active matrix backplane includes numerous deposition and etching steps in order to define appropriate patterns of the backplane.

Because of the number of steps required to form an active matrix backplane with the photolithographic manufacturing process, foundries of adequate capacity for volume production of backplanes are very expensive. An exemplary partial list of equipment needed for manufacturing active matrix backplanes utilizing the photolithographic manufacturing process includes glass-handling equipment, wet/dry strip equipment, glass cleaning equipment, wet clean equipment, plasma chemical vapor deposition (CVD) equipment, laser equipment, crystallization equipment, sputtering equipment, ion implant equipment, resist coater equipment, resist stripping equipment, developer equipment, particle inspection equipment, exposure systems, array filet/repair equipment, dry etch systems, anti-electrostatic discharge equipment, wet etch systems and a clean oven. Furthermore, because of the nature of the photolithographic manufacturing process, the foregoing equipment must be utilized in a class one or class ten clean room. In addition, because of the amount of equipment needed and the size of each piece of equipment, the clean room must have a relatively large area, which can be relatively expensive.

A vapor deposition shadow mask process has been used for years in microelectronics manufacturing. The vapor deposition shadow mask process is significantly less costly and less complex than the photolithography process. However, heretofore, the vapor deposition shadow mask process has not been favored by those of ordinary skill in the art for fabricating large-area backplanes. Publications disclosing vapor deposition shadow mask processes as well as related processes are disclosed in U.S. Patent Application Publication No. 2003/0193285; U.S. Patent Application Publication No. 2002/0011785; U.S. Pat. Ser. No. 6,592,933; U.S. Pat. No. 6,384,529 and U.S. Pat. No. 4,919,749.

What is, therefore, needed, and not disclosed in the prior art, is a method and apparatus for fabricating large-area backplanes via the vapor deposition shadow mask process, rather than utilizing the more costly photolithographic process. Other needs that the present invention fulfills will become apparent to those of ordinary skill in the art upon reading and understanding the following detailed description.

SUMMARY OF THE INVENTION

The invention is a vapor deposition shadow mask system that includes a plurality of series connected vacuum vessels each having a material deposition source and a shadow mask position therein and means for translating a substrate along a path that has a longitudinal axis that extends through the vacuum vessels. A center of the shadow mask in a first vacuum vessel is offset laterally to one side of the longitudinal axis of the path and a center of the shadow mask in a second vacuum vessel is offset laterally to the other side of the longitudinal axis of the path.

The system is operative for depositing material on a second area of the substrate via the material deposition source and shadow mask in the second vacuum vessel in a manner that overlaps a portion of material deposited on a first, adjacent area of the substrate via the material deposition source and shadow mask in the first vacuum vessel.

The first and second areas of the substrate are positioned adjacent each other in a direction transverse to the longitudinal axis of the path. The overlap occurs adjacent a boundary between the first and second areas in a direction parallel to the longitudinal axis of the path. Desirably, the first and second areas of the substrate do not overlap.

A center of a shadow mask in a third vacuum vessel can be offset laterally to the same side of the longitudinal axis of the path as the center of the shadow mask in the first vacuum vessel. The system is operative for depositing material on the first area of the substrate via the material deposition source and shadow mask in the third vacuum vessel in a manner that overlaps at least a portion of the material deposited on the first area of the substrate and overlaps a portion of the material deposited on the second area of the substrate.

Also or alternatively, the system is operative for depositing material on a third area of the substrate via the material deposition source and a shadow mask in the first vacuum vessel in a manner that overlaps a portion of the material deposited on the first, adjacent area of the substrate by the material deposition source and shadow mask in the first vacuum vessel.

The first and third areas of the substrate are adjacent each other in a direction parallel to the longitudinal axis of the path. The material deposited on the third area of the substrate overlaps the material deposited on the first area of the substrate in a direction transverse to the longitudinal axis of the path. Desirably, the first, second and third areas of the substrate do not overlap.

The invention is also a vapor deposition shadow mask system that includes a plurality of series connected vacuum vessels each having a material deposition source and a shadow mask position therein and means for translating a substrate along a path that has a longitudinal axis that extends through the vacuum vessels. Centers of shadow masks in first and second vacuum vessels are offset laterally to one side of the longitudinal axis of the path.

The system is operative for depositing material on a second area of the substrate via the material deposition source and shadow mask in the second vacuum vessel in a manner that overlaps a portion of the material deposited on a first, adjacent area of the substrate via the material deposition source and shadow mask in the first vacuum vessel.

The first and second areas of the substrate are adjacent each other in a direction parallel to the longitudinal axis of the path. The overlap occurs adjacent a boundary between the first and second areas in a direction transverse to the longitudinal axis of the path. Desirably, the first and second areas of the substrate do not overlap.

The invention is also a shadow mask vapor deposition method. The method includes (a) positioning a first area of a substrate in operative relation to a material deposition source and shadow mask in a first vacuum vessel; (b) depositing material on the first area of the substrate via the material deposition source and the shadow mask in the first vacuum vessel; (c) advancing the first area of the substrate into a second vacuum vessel along a path that has a longitudinal axis that extends through the vacuum vessels; (d) positioning a second, adjacent area of the substrate in operative relation to a material deposition source and shadow mask in the second vacuum vessel; and (e) depositing material on the second area of the substrate via the material deposition source and the shadow mask in the second vacuum vessel in a manner that overlaps a portion of the material deposited on the first area of the substrate, wherein centers of the shadow masks in the first and second vacuum vessels are offset laterally on opposite sides of the longitudinal axis of the path.

The overlap occurs adjacent a boundary between the first and second areas in a direction parallel to the longitudinal axis of the path. Desirably, the first and second areas of the substrate do not overlap.

The method can also include (f) advancing the first area of the substrate into a third vacuum vessel along the path; (g) positioning the first area of the substrate in operative relation to a material deposition source and shadow mask in the third vacuum vessel; and (h) depositing material on the first area of the substrate via the material deposition source and the shadow mask in the third vacuum vessel in a manner that overlaps at least a portion of the material deposited on the first area of the substrate via the material deposition source and the shadow mask in the first vacuum vessel and overlaps a portion of the material deposited on the second area of the substrate, wherein centers of the shadow masks in the first and third vacuum vessels are offset laterally to the same side of the longitudinal axis of the path.

The method can also include advancing the first area of the substrate into the second vacuum vessel along the path and positioning a third area of the substrate in operative relation to the material deposition source and shadow mask in the first vacuum vessel, wherein the third area of the substrate is adjacent the first area of the substrate. Material is deposited on the third area of the substrate via the material deposition source and the shadow mask in the first vacuum vessel in a manner that overlaps at least a portion of the material deposited on the first area of the substrate.

Desirably, the first, second and third areas of the substrate do not overlap. The material deposited on the third area overlaps the material deposited on the first area adjacent a boundary between the first and third areas in a direction transverse to the longitudinal axis of the path.

Lastly, the invention is a shadow mask vapor deposition method. The method includes (a) positioning a first area of a substrate in operative relation to a material deposition source and shadow mask in a first vacuum vessel; (b) depositing material on the first area of the substrate via the material deposition source and the shadow mask in the first vacuum vessel; (c) advancing the first area of the substrate into a second vacuum vessel along a path that has a longitudinal axis that extends through the vacuum vessels; (d) positioning a second, adjacent area of the substrate in operative relation to a material deposition source and shadow mask in the second vacuum vessel; and (e) depositing material on the second area of the substrate via the material deposition source and the shadow mask in the second vacuum vessel in a manner that overlaps a portion of the material deposited on the first area of the substrate, wherein centers of the shadow masks in the first and second vacuum vessels are offset laterally to one side of the longitudinal axis of the path.

BRIEF DESCRIPTION OF THE DRAWINGS

FIG. 4A illustrates an enlarged view of Detail A in FIG. 2;

FIG. 4B is a cross-sectional view taken along lines IVB—IVB in FIG. 4A; and

DETAILED DESCRIPTION OF THE INVENTION

Figure 1:
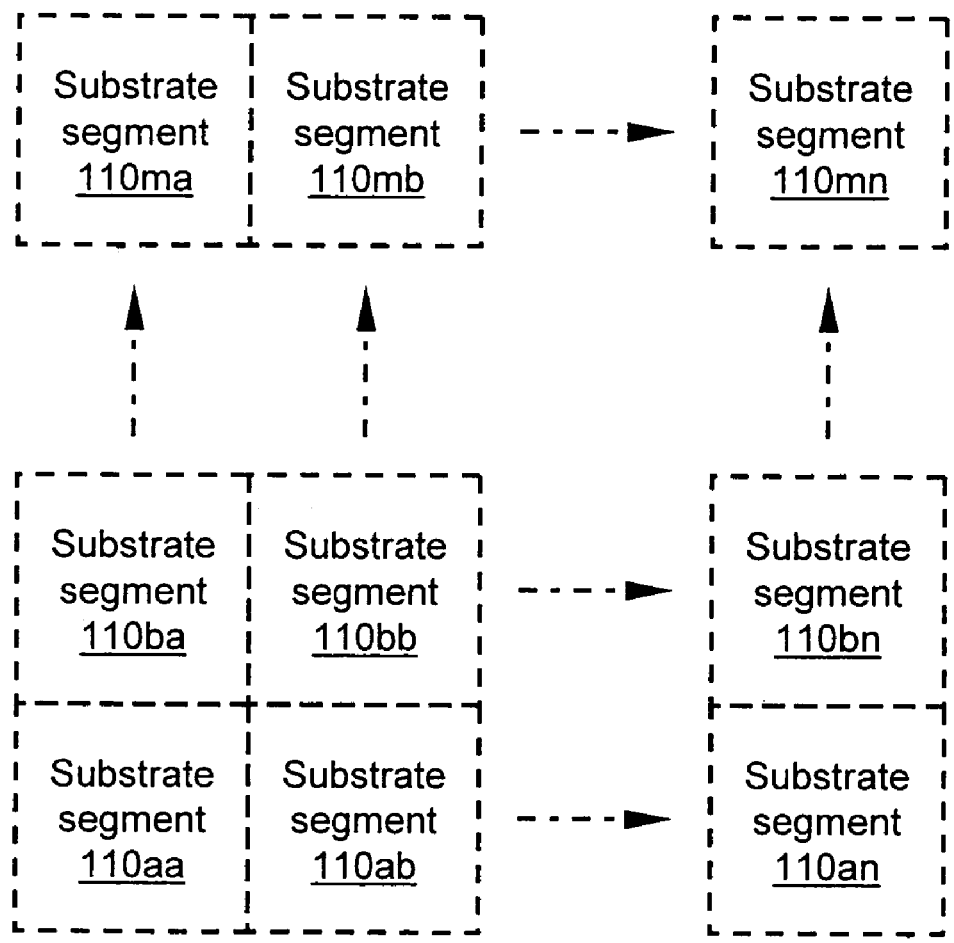
FIG. 1 illustrates a scalable backplane in accordance with the invention, which is formed of an m×n array of substrate segments upon a common substrate.

With reference to FIG. 1, a scalable backplane 100 formed of an m×n array of substrate segments 110 upon a common substrate is sized according to, for example, a desired size of a large-area display. For example, scalable backplane 100 can be an array formed from substrate segment 110aa–110mn. Each substrate segment 110 is formed via its own deposition event upon the common substrate, as described in further detail hereinafter.

Figure 2:
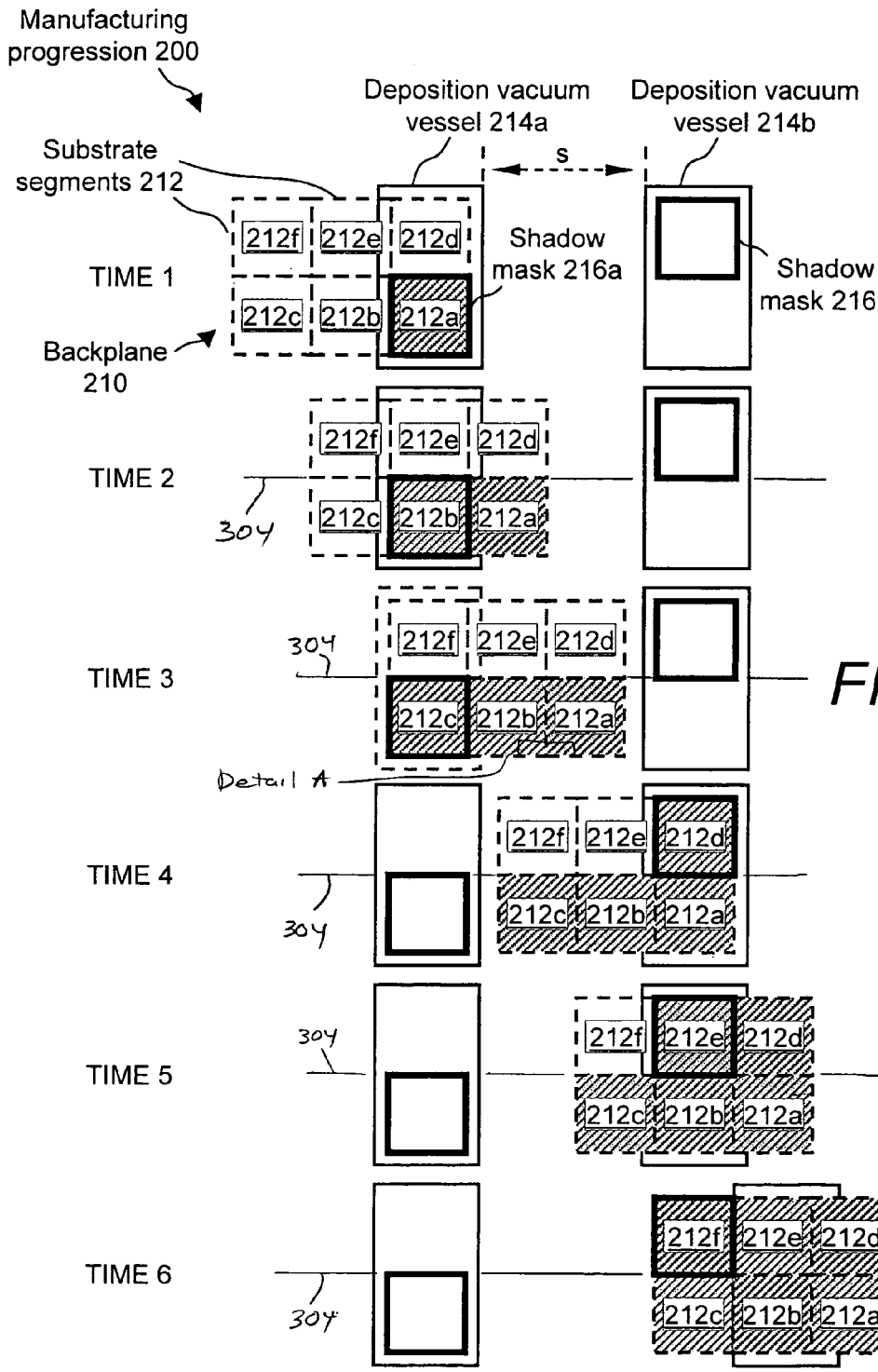
FIG. 2 illustrates a timed view of an exemplary manufacturing progression in accordance with the invention.

With reference to FIG. 2, an exemplary manufacturing process 200 for progressively forming a backplane 210, that includes a 3×2 array of substrate segments 212a, 212b, 212c, 212d, 212e and 212f, via a shadow mask deposition process within a serial arrangement of deposition vacuum vessels 214a and 214b is shown. Deposition vacuum vessels 214a and 214b include shadow masks 216a and 216b, respectively. Backplane 210 and substrate segments 212 correspond to backplane 100 and substrate segments 110 in FIG. 1.

One layer of backplane 210 is formed by a number of deposition events on multiple successive substrate segments 212. More specifically, at a TIME 1, a deposition event occurs upon substrate segment 212a within deposition vacuum vessel 214a by use of shadow mask 216a. The substrate is then advanced and, at a TIME 2, a subsequent deposition event occurs upon substrate segment 212b within deposition vacuum vessel 214a by use of shadow mask 216a. The substrate is then advanced and, at a TIME 3, a subsequent deposition event occurs upon substrate segment 212c within deposition vacuum vessel 214a by use of shadow mask 216a.

Upon completion of the deposition events along the line of substrate segments 212a, 212b and 212c, the substrate is advanced into deposition vacuum vessel 214b, wherein shadow mask 216b is positionally offset relative to shadow mask 216a in order to form the next line of substrate segments 212. At a TIME 4, a deposition event occurs upon substrate segment 212d within deposition vacuum vessel 214b by use of shadow mask 216b. The substrate is then advanced and, at a TIME 5, a subsequent deposition event occurs upon substrate segment 212e within deposition vacuum vessel 214b by use of shadow mask 216b. The substrate is then advanced and, at a TIME 6, a subsequent deposition event occurs upon substrate segment 212f within deposition vacuum vessel 214b by use of shadow mask 216b. In this way, one layer of backplane 210 that is the combination of a 3×2 array of substrate segments 212 is formed by sequential deposition events at TIME 1, 2, 3, 4, 5 and 6 by use of shadow masks 216a and 216b. The aperture layout and design of shadow masks 216a and 216b is such that they achieve electrical connections between adjacent substrate segments 212 at their boundaries, where required.

A spacing "s" between deposition vacuum vessels 214a and 214b can be any suitable or desirable distance that enables backplane 210 to pass from deposition vacuum vessel 214a to deposition vacuum vessel 214b while enabling deposition vacuum vessels 214a and 214b to operate without interference. To this end, spacing "s" can be zero. However, this is not to be construed as limiting the invention. For practical purposes, spacing "s" is suitably large to allow backplane 210 to have a wide range of dimensions while using a common configuration of deposition vacuum vessels 214.

Using a combination of multiple deposition vacuum vessels and shadow masks, scalable backplane 100 may be formed of any m×n array of substrate segments 110 in a manner similar to that of backplane 210 and substrate segments 212.

Figure 3A:
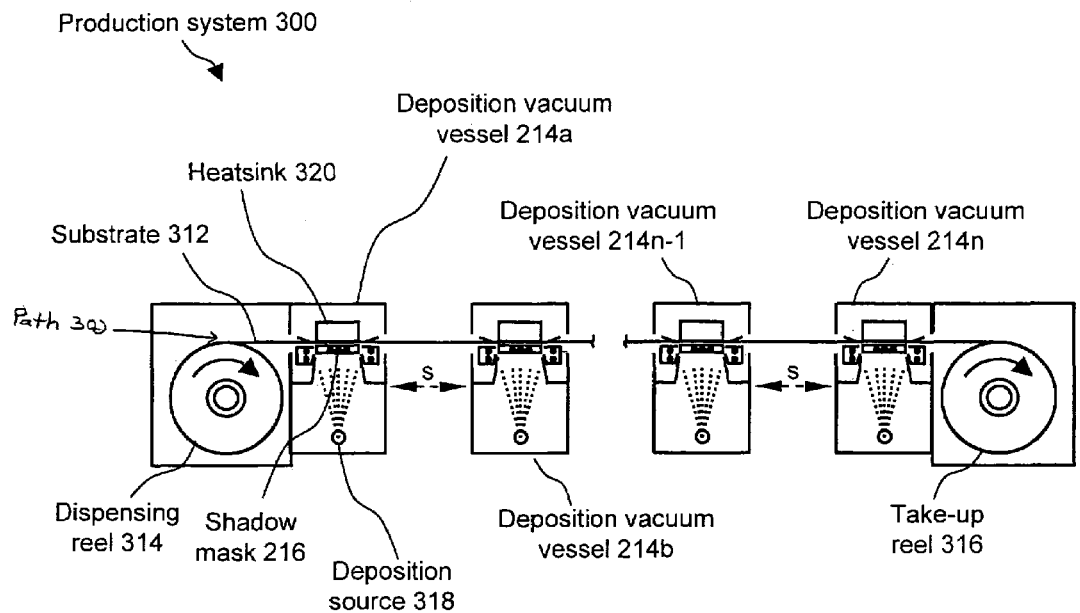
FIGS. 3A and 3B illustrate side and top views, respectively, of an exemplary production system for forming large-area backplanes in accordance with the invention.
Figure 3B:
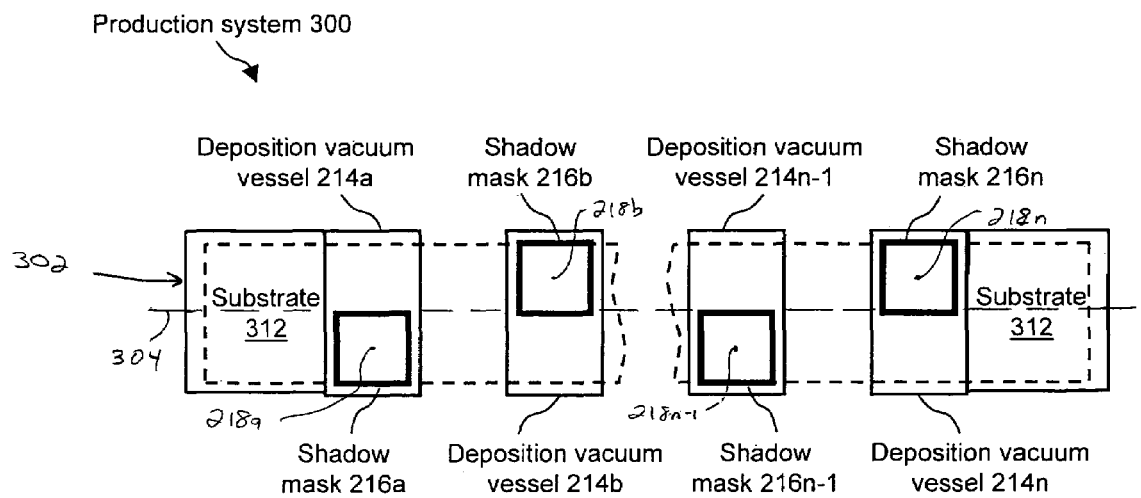

With reference to FIGS. 3A and 3B, an exemplary production system 300 representative of a system for producing an electronic device, such as an active matrix backplane that has OLEDs deposited thereon, is shown. In the illustrated example, production system 300 is configured to form a scalable backplane 100 formed of an n×2 array of substrate segments 110. However, this is not to be construed as limiting the invention since production system 300 can be configured for forming a scalable backplane 100 formed of any m×n array of substrate segments 110. An example of a suitable production system 300 is disclosed in U.S. Patent Application Publication No. 2003/0228715, entitled "Active Matrix Backplane For Controlling Controlled Elements and Method Of Manufacture Thereof", which is incorporated herein by reference.

Production system 300 includes a plurality of serially connected deposition vacuum vessels 214a–214n. Production system 300 includes means for translating a substrate 312 along a path 302 that has a longitudinal axis 304 that extends through vacuum vessels 214a–214n. Each deposition vacuum vessel 214 includes at least one deposition source 318, a heatsink 320 and a shadow mask 216. More specifically, deposition vacuum vessels 214a–214n house shadow masks 216a–216n, respectively. In the illustrated embodiment of production system 300, a center 218a of shadow mask 216a in deposition vacuum vessel 214a is offset laterally to one side of longitudinal axis 304 while a center 218b of shadow mask 216b in deposition vacuum vessel 214b is offset laterally to the other side of longitudinal axis 304. Depending upon the number of deposition events production system 300 is required to perform, production system 300 can also have a center 218n-1 of shadow mask 216n-1 of deposition vacuum vessel 214n-1 offset laterally to the same side of longitudinal axis 304 as the center 218a of shadow mask 216a.

In the illustrated embodiment of production system 300, centers 218a–218n of shadow masks 216a–216n, respectively, are illustrated as being alternatingly offset on different sides of longitudinal axis 304. For example, center 218a of shadow mask 216a is offset to a first side of longitudinal axis 304, center 218b of shadow mask 216b is offset to a second side of longitudinal axis 304, center 218n-1 of shadow mask 216n-1 is offset to the first side of longitudinal axis 304, and so forth. However, this is not to be construed as limiting the invention since any pair of adjacent deposition vacuum vessels 214 can have their respective shadow masks 216 positioned on the same side of longitudinal axis 304. Hence, the alternating position of the centers 218 of shadow masks 216 on opposite sides of longitudinal axis 304 in FIG. 3B is not to be construed as limiting the invention.

Each shadow mask 216 is formed of, for example, nickel, chromium, steel, copper, Kovar®, or Invar®, having a thickness of, for example, 150–200 microns. In the United States, Kovar® is a registered trademark, Registration No. 337,962, currently owned by CRS Holdings, Inc. of Wilmington, Del., and Invar® is a registered Trademark, Registration No. 63,970, currently owned by Imphy S.A. Corporation of France.

Each deposition source 318 is charged with a desired material to be deposited onto a flexible substrate 312 through a corresponding shadow mask 216. Each heatsink 320 is a top plate that has a large mass that provides a flat reference surface that is in contact with the non-deposition side of substrate 312 and which serves as a heat removal means for substrate 312 as it translates through production system 300. Production system 300 may include additional stages (not shown), such as an anneal stage, a test stage, one or more cleaning stages, a cut and mount stage, and the like, as is well known. The number, purpose and arrangement of deposition vacuum vessels 214 can be modified, as needed, for the deposition of one or more materials required for a particular application by one of ordinary skill in the art.

Each shadow mask 216 includes a pattern of apertures (not shown), e.g., slots and holes. The pattern of apertures formed in each shadow mask 216 corresponds to a desired pattern of material to be deposited on substrate 312 from the deposition source 318 in the corresponding deposition vacuum vessel 214 as substrate 312 advances therethrough. Each shadow mask 216 is desirably configured such that a material deposited therewith overlaps a material deposited by another, e.g., preceding, deposition event thereby providing a "stitching" effect that allows the formation of a large-area backplane.

Deposition vacuum vessels 214 are utilized for depositing materials on substrate 312 in order to form one or more electronic elements on substrate 312. Each electronic element may be, for example, a thin film transistor (TFT), a diode, a memory element or a capacitor. A multi-layer circuit can be formed solely by the successive deposition of materials on substrate 312, i.e., without having to perform an etch pattern, via the successive operation of each deposition vacuum vessel 214.

Each deposition vacuum vessel 214 is connected to a source of vacuum (not shown) used for establishing a suitable vacuum therein. More specifically, the source of the vacuum establishes a suitable vacuum in one or more deposition vacuum vessels 214, in order to enable a charge of the desired material that is positioned in deposition sources 318 to be deposited on substrate 312 in a manner known in the art, e.g., sputtering or vapor phase deposition, through apertures within the sheets of shadow masks 216.

In the following description, substrate 312 will be described as being a continuous flexible sheet, which is initially disposed on a dispensing reel 314 that dispenses substrate 312 into the first deposition vacuum vessel 214. However, production system 300 can be configured to continuously process a plurality of individual substrates 312. Dispensing reel 314 is positioned in a preload vacuum vessel, which is connected to a source of vacuum (not shown) used for establishing a suitable vacuum therein. Each deposition vacuum vessel 214 includes supports or guides that avoid the sagging of substrate 312 as it advances through deposition vacuum vessels 214.

In operation of production system 300, the material of each deposition source 318 is deposited on substrate 312 via the corresponding shadow mask 216 in the presence of a suitable vacuum as substrate 312 is step advanced through the corresponding deposition vacuum vessel 214 whereupon plural progressive patterns are formed on substrate 312. More specifically, substrate 312 has plural portions, each of which is positioned for a predetermined interval in each deposition vacuum vessel 214 where a deposition event is to occur. During this predetermined interval, material is deposited from the deposition sources 318 onto the portion of substrate 312 that is positioned in the corresponding deposition vacuum vessel 214. After this predetermined interval, substrate 312 is step advanced, whereupon the plural portions of substrate 312 are advanced to the next deposition vacuum vessel 214 in series for additional processing, as applicable. This step advancement continues until each portion of substrate 312 has passed through all deposition vacuum vessels 214. Thereafter, each portion of substrate 312 exiting the final deposition vacuum vessel 214 in the series is received on a take-up reel 316 which is positioned in a storage vacuum vessel. Alternatively, each portion of substrate 312 exiting deposition vacuum vessel 214 is separated from the remainder of substrate 312 by a cutter (not shown).

Figure 3C:
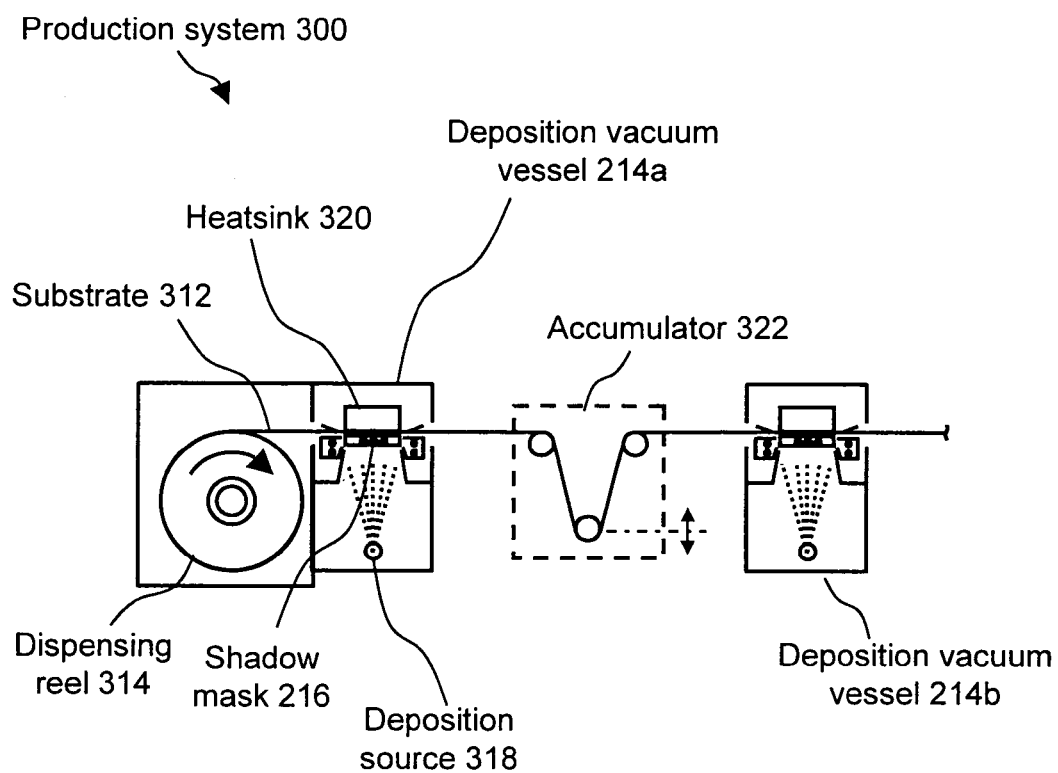
FIG. 3C illustrates the production system of the present invention with an optional accumulator device installed.

With reference to FIG. 3C, production system 300 can include an optional accumulator 322 installed in series between one or more pairs of adjacent deposition vacuum vessels 214. Accumulator 322 desirably includes a series of non-adjustable and/or adjustable rollers for transporting substrate 312. The spacing "s" between deposition vacuum vessels 214 is therefore not dependent upon the backplane pattern dimensions and, thus, a common configuration of deposition vacuum vessels 214 within production system 300 is suitable for the production of any backplane design.

With reference to FIG. 4A, an enlarged view of Detail A in FIG. 2 shows exemplary conductors 410a and 410b at the boundary of two adjacent substrate segments, e.g., substrate segments 212a and 212b, respectively. FIG. 4B illustrates a cross-sectional view of conductors 410a and 410b taken along line IVB—IVB in FIG. 4A. FIG. 4B illustrates the overlap or "stitching" of conductor 410a of substrate segment 212a to conductor 410b of substrate segment 212b which enables electrical conductivity between the conductors 410a and 410b. In one example, an overlap 412 of conductor 410a of substrate segment 212a to conductor 410b of substrate segment 212b is in the range of 10 to 15 µm. Conductors 410a and 410b can be deposited via the same shadow mask as shown in the example of FIG. 2. Alternatively, conductor 410a can be deposited via one shadow mask while conductor 410b can be deposited via another shadow mask positioned on the same side of longitudinal axis 304 in FIG. 3B.

In addition to "stitching" of material deposited on substrate segments that are adjacent each other in a direction parallel to longitudinal axis 304, production system 300 can "stitch" material deposited on substrate segments that are adjacent each other in a direction transverse, desirably perpendicular, to longitudinal axis 304. Hence, the overlap or "stitching" of material can occur either parallel or transverse, desirably perpendicular, to the direction of longitudinal axis 304.

Figure 5:
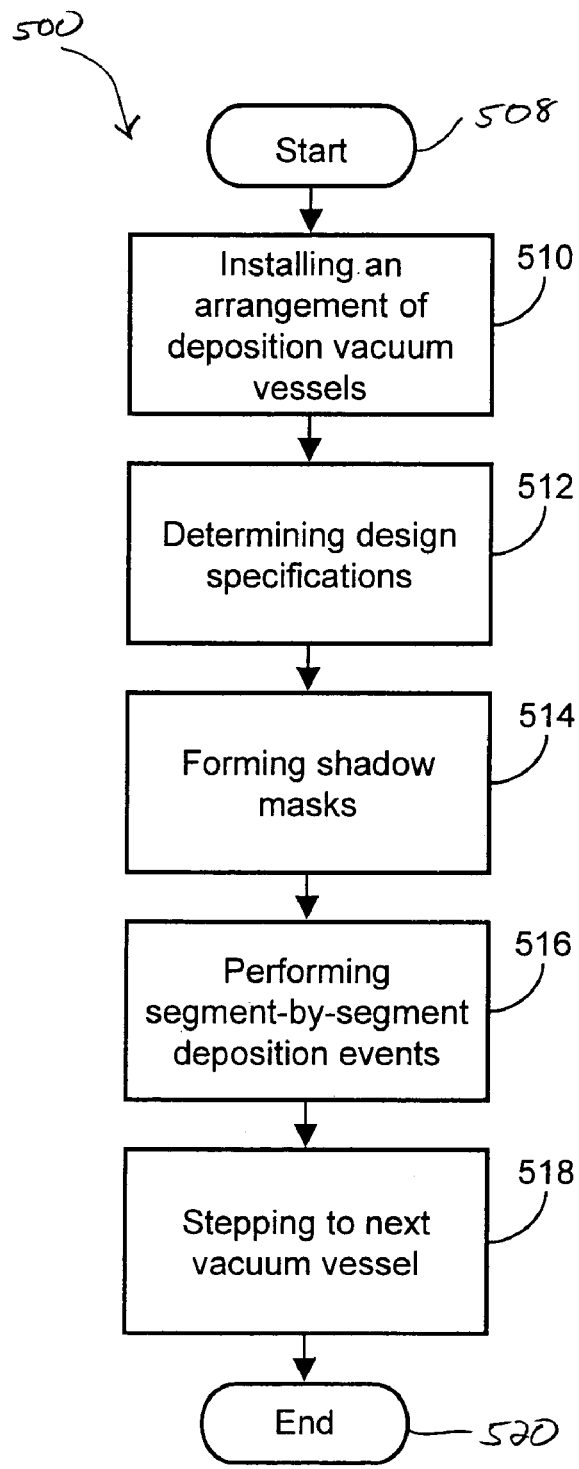
FIG. 5 is a flow diagram of a method whereby each layer of a backplane is formed by multiple deposition events of multiple successive segments, respectively.

With reference to FIG. 5, and with continuing reference to FIGS. 1–4B, a flow diagram 500 of a method, wherein each layer of a backplane is formed by multiple deposition events of multiple successive segments, each segment is a repetitive pattern, and stitching of the conductors takes place at the boundaries of the segments to form continuous conductive paths is shown.

Initially, the method advances from a start step 508 to a step 510 wherein a plurality of deposition vacuum vessels 214 is installed in series to form a production system, such as production system 300.

The method advances to step 512 wherein the design specifications of the specific structure to be formed via production system 300, for example, a circuit layout, are determined.

In step 514, a shadow mask, such as shadow mask 216, for each layer of the structure defined in step 512 is formed. The plurality of apertures within each shadow mask is arranged according to the predetermined pattern for each layer of the structure, as defined in step 510.

In step 516, a deposition event is performed on a segment, like segment 212 of substrate 312 positioned in a deposition vacuum vessel 214.

In step 518, substrate 312 advances into the next successive deposition vacuum vessel 214 for processing. The method then advances to end step 520 where the method terminates.

The method may be repeated for any number of continuous or discrete substrates 312 formed of any number of substrate segments whose conductors are "stitched" at the boundaries of adjacent substrate segments to form a seamless backplane structure.

Production system 300 can be configured to enable one substrate segment to experience a deposition event in one deposition vacuum vessel 214 while, concurrently, another substrate segment experiences a deposition event in another deposition vacuum vessel 214. Stitching at the boundaries of each adjacent substrate segment 110 enables the formation of a seamless backplane that is scalable to any dimension.

As can be seen, production system 300 and flow diagram 500 provide a system and method for forming a large-area display backplane utilizing the same manufacturing process and small-area shadow mask(s) that are also utilized for small- or medium-sized displays by performing m×n deposition events in order to form the backplane.

Production system 300 and the method of flow diagram 500 are not limited to forming a large-area matrix flat panel display backplane, but are also applicable to any scalable circuit layout that may be segmented into a repetitive pattern to be used for any purpose.

The present invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A vapor deposition shadow mask system comprising:
a plurality of series connected vacuum vessels each having a material deposition source and a shadow mask housed completely therein; and
means for translating a substrate along a path that has a longitudinal axis that extends through the vacuum vessels, wherein a center of the shadow mask in a first vacuum vessel is offset laterally to one side of the longitudinal axis of the path and a center of the shadow mask in a second vacuum vessel is offset laterally to the other side of the longitudinal axis of the path.

2. The system of claim 1, wherein the system is operative for depositing material on a second area of the substrate via the material deposition source and the shadow mask in the second vacuum vessel in a manner that overlaps a portion of material deposited on a first, adjacent area of the substrate via the material deposition source and the shadow mask in the first vacuum vessel.

3. The system of claim 2, wherein the first and second areas of the substrate are adjacent each other in a direction transverse to the longitudinal axis of the path.

4. The system of claim 2, wherein the overlap occurs adjacent a boundary between the first and second areas in a direction parallel to the longitudinal axis of the path.

5. The system of claim 2, wherein the first and second areas of the substrate do not overlap.

6. The system of claim 2, wherein:
a center of a shadow mask in a third vacuum vessel is offset laterally to the same side of the longitudinal axis of the path as the center of the shadow mask in the first vacuum vessel; and
the system is operative for depositing material on the first area of the substrate via the material deposition source and the shadow mask in the third vacuum vessel in a manner that overlaps at least a portion of the material deposited on the first area of the substrate and overlaps a portion of the material deposited on the second area of the substrate.

7. The system of claim 2, wherein the system is operative for depositing material on a third area of the substrate via the material deposition source and the shadow mask in the first vacuum vessel in a manner that overlaps a portion of material deposited on the first, adjacent area of the substrate via the material deposition source and the shadow mask in the first vacuum vessel.

8. The system of claim 7, wherein the first and third areas of the substrate are adjacent each other in a direction parallel to the longitudinal axis of the path.

9. The system of claim 7, wherein the material deposited on the third area of the substrate overlaps the material deposited on the first area of the substrate in a direction transverse to the longitudinal axis of the path.

10. The system of claim 7, wherein the first, second and third areas of the substrate do not overlap.

11. A vapor deposition shadow mask system comprising:
a plurality of series connected vacuum vessels each having a material deposition source and a shadow mask housed completely therein; and
means for translating a substrate along a path that has a longitudinal axis that extends through the vacuum vessels, wherein centers of shadow masks in first and second vacuum vessels are offset laterally to one side of the longitudinal axis of the path.

12. The system of claim 11, wherein the system is operative for depositing material on a second area of the substrate via the material deposition source and the shadow mask in the second vacuum vessel in a manner that overlaps a portion of material deposited on a first, adjacent area of the substrate via the material deposition source and the shadow mask in the first vacuum vessel.

13. The system of claim 12, wherein the first and second areas of the substrate are adjacent each other in a direction parallel to the longitudinal axis of the path.

14. The system of claim 12, wherein the overlap occurs adjacent a boundary between the first and second areas in a direction transverse to the longitudinal axis of the path.

15. The system of claim 12, wherein the first and second areas of the substrate do not overlap.

16. A shadow mask vapor deposition method comprising:
(a) positioning a first area of a substrate in operative relation to a material deposition source and shadow mask housed completely in a first vacuum vessel;
(b) depositing material on the first area of the substrate via the material deposition source and the shadow mask in the first vacuum vessel;
(c) advancing the first area of the substrate into a second vacuum vessel along a path that has a longitudinal axis that extends through the vacuum vessels;
(d) positioning a second, adjacent area of the substrate in operative relation to a material deposition source and shadow mask housed completely in the second vacuum vessel; and
(e) depositing material on the second area of the substrate via the material deposition source and the shadow mask in the second vacuum vessel in a manner that overlaps a portion of the material deposited on the first area of the substrate, wherein centers of the shadow masks in the first and second vacuum vessels are offset transverse on opposite sides of the longitudinal axis of the path.

17. The method of claim 16, wherein the overlap occurs adjacent a boundary between the first and second areas in a direction parallel to the longitudinal axis of the path.

18. The method of claim 16, wherein the first and second areas of the substrate do not overlap.

19. The method of claim 16, further including:
(f) advancing the first area of the substrate into a third vacuum vessel along the path;
(g) positioning the first area of the substrate in operative relation to a material deposition source and shadow mask housed completely in the third vacuum vessel; and
(h) depositing material on the first area of the substrate via the material deposition source and the shadow mask in the third vacuum vessel in a manner that overlaps at least a portion of the material deposited on the first area of the substrate via the material deposition source and the shadow mask in the first vacuum vessel and overlaps a portion of the material deposited on the second area of the substrate, wherein centers of the shadow masks in the first and third vacuum vessels are offset laterally to the same side of the longitudinal axis of the path.

20. The method of claim 16, further including:

positioning a third area of the substrate in operative relation to the material deposition source and the shadow mask in the first vacuum vessel, wherein the third area of the substrate is adjacent the first area of the substrate; and depositing material on the third area of the substrate via the material deposition source and the shadow mask in the first vacuum vessel in a manner that overlaps at least a portion of the material deposited on the first area of the substrate.

21. The method of claim 20, wherein the first, second and third areas of the substrate do not overlap.

22. The method of claim 20, wherein the material deposited on the third area overlaps the material deposited on the first area adjacent a boundary between the first and third areas in a direction transverse to the longitudinal axis of the path.

23. A shadow mask vapor deposition method comprising:
   (a) positioning a first area of a substrate in operative relation to a material deposition source and shadow mask housed completely in a first vacuum vessel;
   (b) depositing material on the first area of the substrate via the material deposition source and the shadow mask in the first vacuum vessel;
   (c) advancing the first area of the substrate into a second vacuum vessel along a path that has a longitudinal axis that extends through the vacuum vessels;
   (d) positioning a second, adjacent area of the substrate in operative relation to a material deposition source and shadow mask housed completely in the second vacuum vessel; and
   (e) depositing material on the second area of the substrate via the material deposition source and the shadow mask in the second vacuum vessel in a manner that overlaps a portion of the material deposited on the first area of the substrate, wherein centers of the shadow masks in the first and second vacuum vessels are offset laterally to one side of the longitudinal axis of the path.

24. The method of claim 23, wherein the overlap occurs adjacent a boundary between the first and second areas in a direction transverse to the longitudinal axis of the path.

25. The method of claim 23, wherein the first and second areas of the substrate do not overlap.

* * * * *